United States Patent [19]

Rahilly

[11] 4,070,205
[45] Jan. 24, 1978

[54] ALUMINUM ARSENIDE EUTECTIC GALLIUM ARSENIDE SOLAR CELL

[75] Inventor: William P. Rahilly, Dayton, Ohio

[73] Assignee: The United States of America as represented by the Secretary of the Air Force, Washington, D.C.

[21] Appl. No.: 748,578

[22] Filed: Dec. 8, 1976

[51] Int. Cl.² .................................................. H01L 31/06
[52] U.S. Cl. .................................. 136/89 SJ; 29/572; 357/30; 357/91; 357/90; 148/1.5
[58] Field of Search .......... 136/89 SG, 89 SJ, 89 CC; 29/572; 357/30, 90, 91; 148/1.5, 171

[56] References Cited

U.S. PATENT DOCUMENTS

| 3,675,026 | 7/1972 | Woodall | 250/211 J |
| 3,969,746 | 7/1976 | Kendall et al. | 357/30 |

OTHER PUBLICATIONS

R. K. Smeltzer et al., "Vertical Multijunction Solar Cell Fabrication," Conf. Record, 10th IEEE Photospecialists' Conf., Palo Alto, Calif., Nov. 1973, pp. 194–196.
K. V. Vaidyanathan et al., "The Effect of Be+ Ion Implantation and Uniform Impurity Profiles on the Electrical Characteristics of GaAs Solar Cells," Conf. Record, 10th IEEE Photospecialists' Conf., Palo Alto, Calif., Nov. 1973, pp. 31-33.

Primary Examiner—John H. Mack
Assistant Examiner—Aaron Weisstuch
Attorney, Agent, or Firm—Joseph E. Rusz; Robert Kern Duncan

[57] ABSTRACT

An improved gallium arsenide solar cell is provided by forming a P+ layer on top of a wafer of plural vertical PN junction eutectic gallium arsenide crystal by liquid phase epitaxial growth of P doped GaAs followed by liquid phase epitaxial growth at $Al_xAsGa_{1-x}$ on the surface of the vertical PN junction substrate. The deposited GaAs layer with P dopant and the $Al_xAsGa_{1-x}$ layer forms horizontal P-N junctions with the N-type vertical regions. An N+ region is formed on the solar cell backside by ion implantation of an N dopant followed by a pulse electron beam current of the implanted region.

2 Claims, 3 Drawing Figures

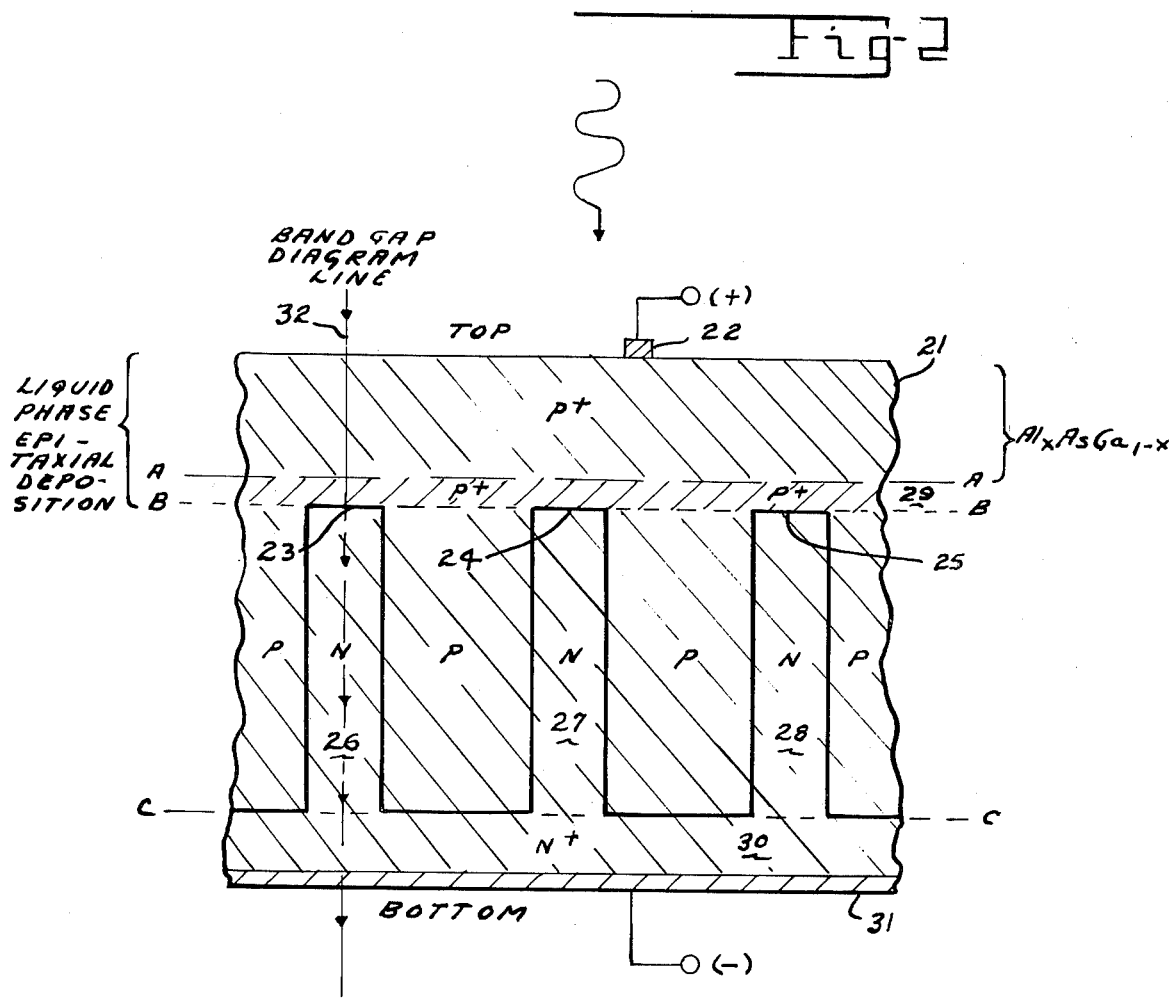

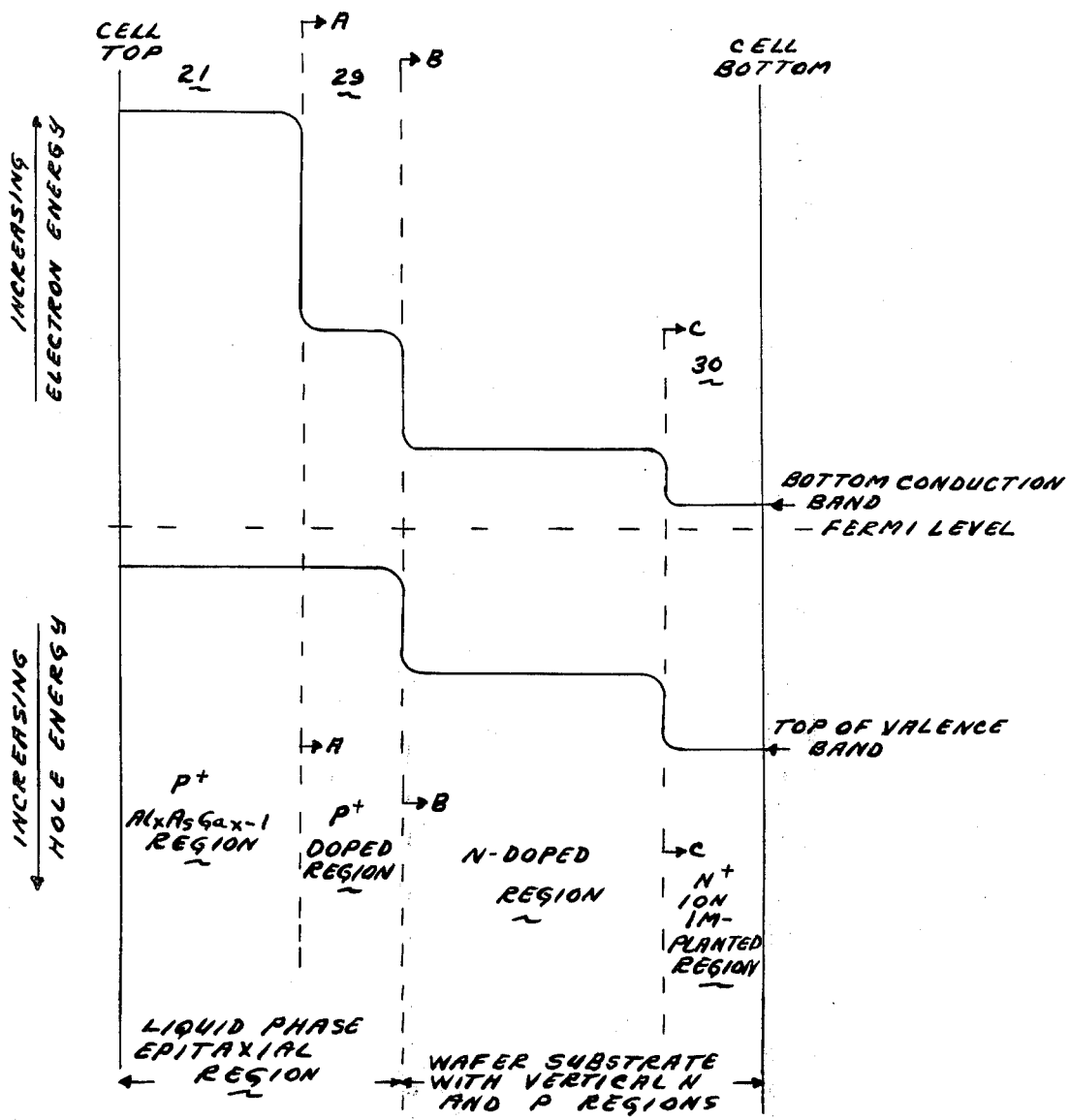

ALUMINUM ARSENIDE EUTECTIC GALLIUM ARSENIDE SOLAR CELL

RIGHTS OF THE GOVERNMENT

The invention described herein may be manufactured and used by or for the Government of the United States for all governmental purposes without the payment of any royalty.

BACKGROUND OF THE INVENTION

The field of the invention is in the solar cell art.

P doped aluminum arsenide deposition by liquid phase epitaxial growth on a gallium arsenide substrate to provide solar cells and photocathodes are known. Such devices are disclosed by J. M. Woodall in U.S. Pat. No. 3,675,026, and M. C. Rowland et al. in U.S. Pat. No. 3,932,883. Crystal growing techniques and structures suitable for solar cells are well known. Chou H. Li in U.S. Pat. Nos. 3,500,135 and 3,765,956 teaches this art. Vertical junction solar cells are known. J. F. Wise and D. L. Kendall et al. teach these structures in U.S. Pat. Nos. 3,690,953 and 3,969,746 respectively.

SUMMARY OF THE INVENTION

An improved gallium arsenide solar cell is disclosed that has a much lower series resistance and higher conversion efficiency than prior art devices. By improving the efficiency of gallium arsenide cells to make their usage more practical, the natural resistance to damage effects from particulate radiation damage to gallium arsenide over the prior art silicon devices may now be utilized. A unique feature of the invention is the creation of horizontal junctions on plural vertical junction substrate material with an aluminum arsenide-gallium arsenide P+ layer providing a common connection to all P regions in the gallium arsenide cell body, which itself contains many closely spaced PN junctions (typically with a micrometer separation), which are perpendicular to the top and bottom surfaces of the cell body. An N+ layer formed by ion implantation on the bottom of the cell provides a common connection to all N regions within the cell body.

BRIEF DESCRIPTION OF THE DRAWING

FIG. 1 is a schematic diagram of a section of a typical prior art gallium arsenide crystal with vertical PN junctions;

FIG. 2 is a schematic diagram of a typical section of an embodiment of the invention; and FIG. 3 is a representative band gap diagram, at zero bias, through the cell at the location shown in FIG. 2.

DESCRIPTION OF THE PREFERRED EMBODIMENT

FIG. 1 illustrates schematically a section of a typical prior art crystal wafer grown using conventional techniques to form an ingot of eutectic gallium arsenide with a plurality of photovoltaic PN junctions formed parallel to the crystal growth axis 11. Wafers are conventionally cut perpendicular to the crystal growth axis and conventionally prepared for liquid phase epitaxial deposition of P doped GaAs and $Al_xAsGa_{l-x}$. Suitable P dopants are zinc or beryllium. An $Al_xAsGa_{1-x}$ layer is then grown at the top of the crystal wafer to an optimum thickness relative to usage with sunlight in space or terrestrial use. (Typically 0.2 micrometer for space and 2 to 3 times as thick for terrestrial use, to reduce series resistance.) In the embodiment of FIG. 2, which is fabricated from a conventional plural vertical junction eutectic GaAs wafer as just described, the $Al_xAsGa_{1-x}$ layer 21 provides a surface for top contact metallization 22. The $Al_xAsGa_{1-x}$ layer 21 is frequently referred to as the cell window.

Prior to growth of layer 21, however, a P+ layer 29 is fabricated by conventional liquid phase epitaxial growth of P doped GaAs on the top upper surface 12 of said conventional plural vertical PN junction substrate, followed by liquid phase epitaxial deposition of the $Al_xAsGa_{1-x}$ layer 21. As a result horizontal P+N junctions 23, 24, 25, etc., are formed with the N type vertical regions 26, 27, 28, etc.

The chemical composition of layer 21 is represented by $Al_xAsGa_{1-x}$ where "x" is the fractional amount of aluminum occupying lattice sites that would otherwise be occupied by gallium. A typical suitable value for "x" resulting from the liquid phase epitaxial growth is 0.98, (i.e., 98% Al; 2% Ga). The P+ deposited region 29 is substantially depleted of aluminum, i.e., x is approximately zero in this region.

After growing the P doped gallium arsenide and aluminum arsenide layers forming the P+ layer 29 and the P+ layer 21, respectively, on the substrate, an N+ layer 30 is conventionally ion implanted at the bottom of the cell substrate with a conventional N type dopant such as silicon or tellurium. After ion implantation the bottom of the wafer is pulse electron beam annealed. Then conventional electrical contacts 22 and 31, such as tin-gold, zinc-gold or inidium-gold, are deposited by conventional metallization on the upper operative surface of the cell. Contact to the cell bottom is accomplished by using germanium-gold with a nickel overlay in the conventional manner. The top contact metallization is comprised of an ohmic bus with grid fingers to allow passage of light into the cell top surface and collection of charge carriers. The bottom contact metallization covers the entire backside. To complete an operating embodiment, an antireflective coating such as $Ta_2O_3$, $SiO_2$, or $TiO_x$ is applied to the top surface of the cell and the cell top is then conventionally covered with a conventional glass coverslip made of a material such as fused quartz or borosilicate.

Representative typical embodiments of the invention have a total cell thickness of approximately 250 micrometers. The thickness of the N+ layer is approximately 1 micrometer. A typical value for the ion beam dose to implant the N impurity and form the N+ layer is approximately $10^{15}$ ions per square centimeter. Typical suitable values of current density and time length of pulse for the pulse electron beam anneal is a fluence of approximately 0.2 calories per square centimeter with a beam energy of approximately 40 kilo electron volts and a pulse width of approximately one microsecond.

The foregoing parameters will provide suitable structures having band gap characteristics as typically illustrated in FIG. 3, taken along line 32 of FIG. 2 and at zero bias.

I claim:

1. A solar cell comprising:
   a. a wafer formed of a crystal of eutectic gallium arsenide having a plurality of alternating P and N doped regions forming a plurality of vertical PN junctions between a top and a bottom surface thereof;
   b. a first liquid phase epitaxial growth region overlying the said upper surface providing a GaAS P+ region adjacent the said upper surface thereby forming substantially horizontal P+N junctions perpendicular to said vertical PN junctions;

c. a second liquid phase epitaxial growth region providing an $Al_xAsGa_{1-x}$ P+ region overlying the said GaAs P+ region, and providing an operating surface;

d. an N+ region formed by ion implantation into the said bottom surface;

e. a metallization contact positioned on the said operating surface; and f. a metallization contact positioned on the said bottom surface.

2. The method of forming a solar cell on a wafer of eutectic gallium arsenide substrate having a plurality of vertical PN junctions formed between an upper surface and a lower surface comprising the steps of:

a. growing by liquid phase epitaxial deposition a layer of GaAs doped with a P type impurity to provide a P+ layer on the said upper surface of the said substrate;

b. growing by liquid phase epitaxial deposition of a P+ doped $Al_xAsGa_{1-x}$ layer on the said P doped GaAs layer;

c. ion implanting an N type impurity on the said lower surface to provide a N+ region;

d. annealing the said N+ region with a pulsed electron beam;

e. metallizing a contact on the said $Al_xAsGa_{1-x}$; and f. metallizing a contact on the said N+ region.

* * * * *